United States Patent [19]

Manca et al.

[11] Patent Number: 5,064,063

[45] Date of Patent: Nov. 12, 1991

[54] TUBE ASSEMBLY FOR PIN GRID ARRAY MODULES

[75] Inventors: Anthony Manca, Wappingers Falls; Henry Mayron, Poughkeepsie, both of N.Y.

[73] Assignee: International Business Machines Corporation, Armonk, N.Y.

[21] Appl. No.: 564,247

[22] Filed: Aug. 8, 1990

[51] Int. Cl.⁵ .............................................. B65D 73/02
[52] U.S. Cl. ..................................... 206/328; 206/593
[58] Field of Search ............... 206/328, 329, 331, 334, 206/330, 586, 593, 521; 361/212, 220

[56] References Cited

U.S. PATENT DOCUMENTS

| | | |
|---|---|---|
| 4,109,788 | 8/1978 | Hirose et al. ........................ 206/329 |
| 4,298,120 | 11/1981 | Kaneko et al. . |
| 4,355,719 | 10/1982 | Hinds et al. . |
| 4,483,441 | 11/1984 | Akizawa et al. . |
| 4,487,315 | 12/1984 | Azuma . |
| 4,592,481 | 6/1986 | Chen ................................ 206/334 X |
| 4,627,160 | 12/1986 | Herron et al. . |
| 4,635,794 | 1/1987 | Lemmer ............................... 206/328 |
| 4,711,350 | 12/1987 | Yen . |
| 4,736,841 | 4/1988 | Kaneko et al. . |
| 4,815,594 | 3/1989 | Olson . |
| 4,836,371 | 6/1989 | Long et al. . |
| 4,867,308 | 9/1989 | Crawford et al. . |
| 4,971,196 | 11/1990 | Kitamura et al. ................... 206/328 |

FOREIGN PATENT DOCUMENTS 694715  9/1964  Canada ................................ 206/334

Primary Examiner—Bryon P. Gehman
Attorney, Agent, or Firm—Charles W. Peterson, Jr.

[57] ABSTRACT

A carrier for packaged integrated circuit chips with an impact resistant carrying strip which has a plurality of equidistantly spaced square apertures and is contained in plastic shipping tubes. Ceramic Pin Grid Array (CPGA) Modules are carried on the strip with the module's pins protected in pin cavities or aperatures in the carrying strip. Bumpers prevent adjacent modules from chipping each other. A specially designed shipping tube encloses the carrying strip for additional handling protection. The strip also serves to facilitate automated assembly. Anti-static or static sensitive materials may be used for either the tube or the strip or for both.

19 Claims, 2 Drawing Sheets

TUBE ASSEMBLY FOR PIN GRID ARRAY MODULES

BACKGROUND OF THE INVENTION

The present invention relates to a carrier assembly which reduces damage associated with and is suitable for use in connection with packing, transporting and automatic insertion of Ceramic Pin Grid Array (CPGA) Modules.

Many complex integrated circuit chips have high Input/Output (I/O) requirements which Pin Grid Array (PGA) Modules satisfy. PGA modules have at least one chip mounting location on top of a substrate. The substrate is made of insulating material such as plastic for its low cost or ceramic for its thermal conductivity. A protective cap rigidly attached to the substrate encloses all chips mounted on the substrate. The protective cap may be made from the same material as the substrate, or from a different material such as metal. Each chip is mounted at a location which has a plurality of interconnect pads, with at least one interconnect pad for each chip input, each chip output, and each chip power pad. Some chip mounting locations may include additional Engineering Change (EC) pads for rerouting chip interconnects to make functional module changes and corrections or to fix partially bad chips. Most chip interconnect pads will be connected to other interconnect pads or to a termination point, or pin. A module with only one or two chips may be simple enough that all of the module wiring between interconnects and pins may be done on the top surface and the bottom surface of the substrate. A single layer of insulating material would separate the top wiring plane from the bottom wiring plane.

Alternatively, the substrate may have several parallel wiring planes, each plane insulated from adjacent wiring planes by insulating material. Such a substrate may also have wiring planes disposed on its top surface and its bottom surface. Interconnects or vias through an insulating layer connects wires on different wiring planes together. Thus, a signal path can meander from one side of the substrate to another, across several wiring planes to connect a chip interconnect pad on the top surface of the substrate and with a module pin at the bottom surface. A PGA module with multiple chips may have several wires between chips on the substrate for intra-module communication, i.e., where chips can communicate only with other chips on that substrate. However, chip I/O must communicate with other modules and are wired to module pins mounted on or in the bottom surface of the substrate. These substrate Pins form a Grid, densely arranged in an n by m Array, where n is the number of rows of pins and m is the number of columns. Thus, a module having such a substrate is called a PGA module.

A PGA module comprised of several complex integrated circuit chips and intricate intra-module wiring may be quite expensive. The actual cost of the material used to make the module is small. Substrate manufacturing, integrated circuit chip manufacturing, module assembly and testing costs account for most of the cost of the module. See U.S. Pat. No. 4,627,160 for an example of a process for making a multilayer ceramic substrate.

Module components and modules are tested at almost every stage of the module manufacturing process. Substrates are tested or "screened" for defects prior to mounting integrated circuit chips on them. Integrated circuit chips are mass produced on wafers the size of a dinner plate. A single rectangular chip may be replicated several hundred times on a single wafer. Each chip on a wafer is individually tested for manufacturing defects, or flaws, that occur at random wafer locations during almost every manufacturing step. Normally, an integrated circuit chip containing a defect is unusable. The tested wafer is cut up or "diced" into separate chips; the unusable chips are discarded and the good chips are mounted on substrates. These substrates with chips mounted on them, or "decks", are tested for defects which were introduced during chip mount. Any defective decks which can be repaired are then repaired and unrepairable decks are discarded. Decks that tested good or were repaired may then be "burned in", i.e., placed in operation for a short period to allow weak decks to fail. After burn in, the decks are retested. Any deck which tests good is capped; any deck which tests defective, but repairable, is repaired and capped. A capped deck which is a module. Each module may again be tested. Repairable modules are repaired and unrepairable modules are discarded. Good modules are shipped to a distributor and will eventually be assembled into a final assembly. A single microscopic crack in a substrate through a single signal wire would irreparably damage the substrate and render a tested module useless.

Accordingly, for protection, CPGA modules are typically shipped in plastic trays or in boxes which may be lined with protective foam. A substrate made of ceramic material is brittle like china. Although not as fragile as china, a ceramic substrate is breakable. Because ceramic substrates are breakable, even CPGA modules packed in plastic trays may be damaged. For example, a tray may be opened accidentally; the tray's contents spilled onto a hard floor; and some of the modules cracked or shattered. Similarly, by bumping one another in the tray, modules may fracture or chip each other, thus severing delicate substrate wiring. Still another type of damage that might occur is that module pins may be bent from being pushed into the protective foam or from being forced against other modules in the tray. Damage may result from mistreatment in handling when the modules are manually removed from the tray, hand carried to an assembly point, or manually inserted into a final assembly. Yet another type of handling damage occurs when static electricity is transferred to the module from a person touching the module. This type of damage, known as Electro Static Discharge (ESD) damage, may destroy the integrated circuit chip packaged in the CPGA module, while leaving the module exterior and substrate completely untouched and apparently fully functional.

Shipping tubes provide another means for shipping CPGA Modules. A shipping tube usually has a stopper in one end with CPGA packaged chips being slid into the opposite end. Once the tube is filled, a stopper inserted into the loading end keeps the modules in the shipping tube. However, prior art shipping tubes suffer many of the same limitations as packing trays. A CPGA module in a shipping tube is in constant contact with adjacent CPGA modules. So substrates of adjacent modules might be damaged by carelessly shaking the shipping tubes. As with shipping trays, the CPGA modules may be spilled if the stopper falls out of one end of the tube. Handling and ESD damage are just as likely to occur with shipping tubes as with shipping trays.

Some physical module damage may be easily discoverable because of bent pins, broken ceramic packages, or visible cracks in the ceramic. Often, however, module damage is either unnoticeable or nearly invisible. For example, ESD damage may destroy or impair a chip in a module without damaging the module package at all. Modules, thus invisibly damaged during shipping, may become part of a final assembly. Finding a bad chip in a complex assembly is much more difficult than finding a bad chip during module manufacture. Consequently, the expense of finding a defective module in a final assembly is much higher than the cost of finding a defective chip during module manufacture. As a result, companies are continually searching for ways to reduce the module damage which occurs between the point in time just prior to mounting chips in a module and the point in time when the modules are assembled into a final machine or onto a printed circuit card.

Traditional approaches taken to reduce ceramic package module damage include: Insertion of a flexible filler strip in a shipping tube such that the flexible filler strip rides above some of the ceramic modules in the shipping tube; Building of flexible bumpers onto the chip modules; Individually packaging ceramic modules in a protective carrier; and packing components in pockets molded into a plastic carrier tape, where the carrier tape is wound and stored upon a reel.

These approaches, however, still fail to provide adequate protection. For example, a flexible filler strip may hold some of the modules close to the end of the shipping tube firmly in place, but other modules in the tube can still bump one another and can thereby be damaged. Building bumpers onto the ends of the modules avoids the module bumping problem but, adds module manufacturing steps thereby increasing module manufacturing costs and manufacturing time. Individually packaging modules overcomes the bumping problem as well but, requires individual handling which, in addition to increasing costs, increases module exposure to handling related damage. Plastic tape carriers must be flexible enough to allow a tape, loaded with modules, to be wound upon a reel. This flexibility limits the protection afforded components carried in the tape and modules in the tape may still bump one another.

OBJECTS OF THE INVENTION

It is an object of the claimed invention to provide a carrier for integrated circuit chips packaged in modules which will protect modules carried therein from damage during transportation and handling.

It is a further object of the claimed invention to provide a carrier for integrated circuit chips packaged in modules which will protect each module carried therein from physical damage that might otherwise be caused by bumping adjacent modules.

It is a still a further object of the claimed invention to provide a carrier for integrated circuit chips packaged in modules which will protect each module carried therein from electrostatic discharge damage.

It is a still a further object of the claimed invention to provide a carrier for integrated circuit chips packaged in modules which may be adapted to automatic module insertion techniques, and which will protect each module carried therein from electrostatic discharge damage and from physical damage that might otherwise be caused by bumping adjacent modules.

SUMMARY OF THE INVENTION

The present invention is a carrier assembly for packaged integrated circuit chips. The carrier assembly includes a specially designed shipping tube which encloses a chip-carrying strip. The strip has a plurality of apertures or pin-receiving cavities of sufficient size to accept the entire pin grid array of a CPGA module. The cavities protect module pins from damage. The carrier strip is thicker than the longest pin of any CPGA module to be carried on the carrier strip. The portion of the bottom surface of a module carried on the strip which is external to the pin grid array rests on the upper surface of the chip-carrying strip adjacent to the cavity. A bumper is located between adjacent pin cavities and at each end of the strip. The bumpers protect each CPGA module from damage by preventing adjacent modules from bumping each other. The bumpers also serve to hold the CPGA modules in place in the carrying tube. When the strip is loaded into the carrying tube module compartments are defined between bumpers above each cavity. Stops are inserted in the shipping tube ends to hold the carrying strip in the shipping tube. Both the chip-carrying strip and the shipping tube are of materials chosen for shipping conditions and any special protection requirements of the chips shipped therein.

BRIEF DESCRIPTION OF THE DRAWINGS

While the specification concludes with claims particularly pointing out and distinctly claiming that which is regarded as the present invention, details of the preferred embodiments of the invention may be more readily ascertained from the following technical description when read in conjunction with the following drawings wherein:

TECHNICAL DESCRIPTION

Figure 1:
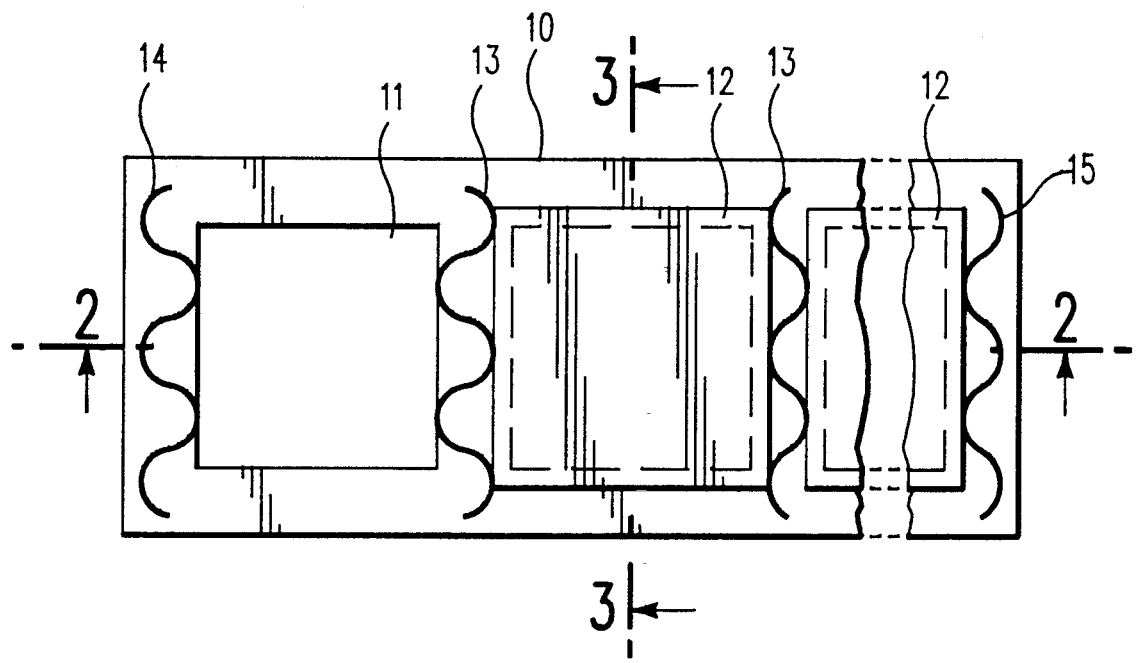
FIG. 1 is a plan view of the chip-carrying strip.
Figure 2:
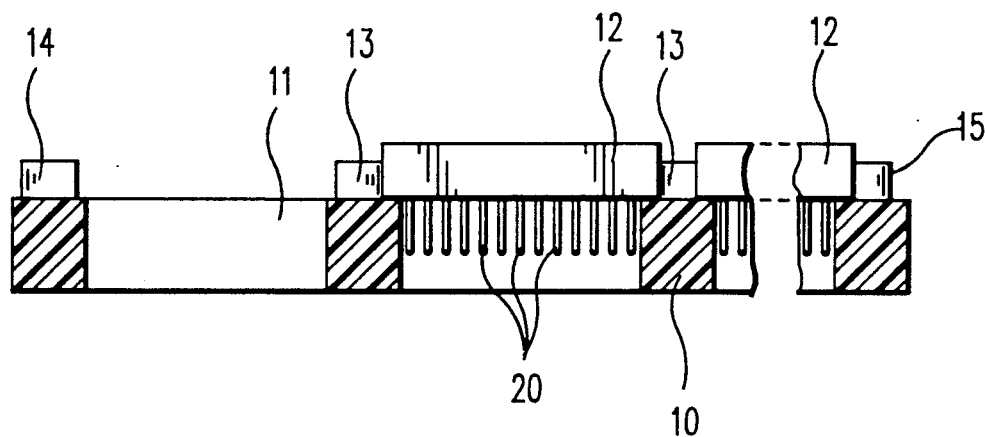
FIG. 2 is a cross-sectional view of the chip carrying strip taken from section line A—A of FIG. 1.

In the preferred embodiment, as set forth below, a chip-carrying strip is enclosed by a carrying tube to define a plurality of module compartments for snugly holding and protecting CPGA modules. FIG. 1 is a plan view of the chip-carrying strip (10). In the preferred embodiment, the chip-carrying strip (10) is a molded plastic strip of a preselected length. The carrying strip (10) is wider than the modules (12) carried on the carrying strip (10). In addition to the protection provided by the resiliency of the plastic which cushions modules (12) on the carrying strip (10) from mechanical shock and vibrations, the plastic used in making the carrying strip (10) may be treated to have anti-static or static sensitive properties to provide protection from ESD damage. See U.S. Pat. No. 4,487,315 for examples of treating plastics to have those properties.

Figure 3:
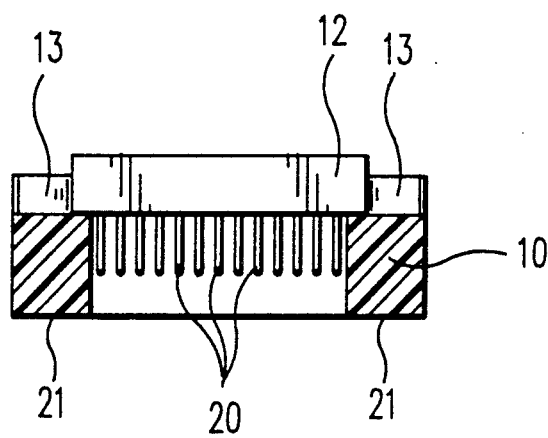
FIG. 3 is a cross-sectional view of a CPGA module on the chip-carrying strip of FIG. 1 taken from section line B—B of FIG. 1.

In the preferred embodiment, the strip (10) has a series equidistantly spaced square apertures or pin-receiving cavities (11). Modules (12) are carried on the strip (10) with all of the module's pins projecting into the pin-receiving cavity (11). Because the module (12) is wider than the pin-receiving cavity (11), the module rests on the strip (10). FIG. 3 is a cross-sectional view of a CPGA module (12) resting on and supported by the chip-carrying strip (10) with module pins (20) extending below the CPGA module into the pin-receiving cavity (11). The pin-receiving cavity (11) is deep enough that every pin (20) on a CPGA module (12) carried on the strip (10) will not project below the lower surface (21) of the strip (10). Alternatively, the bottom of the pin-receiving cavity (11) may be enclosed provided the cavity is deeper than the length of the longest pin on any module to be carried on the chip-carrying strip (10).

In the preferred embodiment, bumpers (13, 14, and 15) are serpentine strips of plastic, integrally molded on the top side of the chip-carrying strip (10) between pin-receiving cavities (11). Alternatively, the bumpers (13, 14, and 15) may be any shape which would provide a horizontal spring loading force and may be attached by any suitable attachment means to the top side of the carrying strip. Each bumper (13) between adjacent pin cavities (11) functions to separate adjacent modules (12) carried on the strip (10). In the preferred embodiment, the strip (10) has a bumper (14 and 15) at each end. The bumpers (13, 14, and 15) are spaced from the pin cavities (11). A module (12) resting on the upper surface of the strip (10) with its pins (20) projecting downwardly into the pin-receiving cavity (11) will be held in place by the spring loading effect from the bumpers located at each end of the cavity. In the preferred embodiment, the bumpers (13, 14, and 15) extend laterally from one side of the chip-carrying strip (10) to the other side. In alternative embodiments the bumpers (13, 14 and 15) may extend for less than the width of the pin-receiving cavity (11).

The bumpers (13, 14 and 15) provide three important functions. First, the bumpers (13, 14 and 15) separate the modules (12) from each other, insuring that the modules (12) don't fracture each other during shipment or handling. Second, because of their resiliency, the bumpers (13, 14 and 15) absorb mechanical shock and vibration, thereby cushioning modules (12) on the chip-carrying strip (10) from external blows. Third, the bumpers (13, 14 and 15) provide a spring loading effect to firmly hold the modules (12) in place. Since the modules are held in place in the shipping tube, there is less likelihood of module pins being bent from the module being forced (20) against a wall of the pin cavity (11) by adjacent walls.

Figure 4:
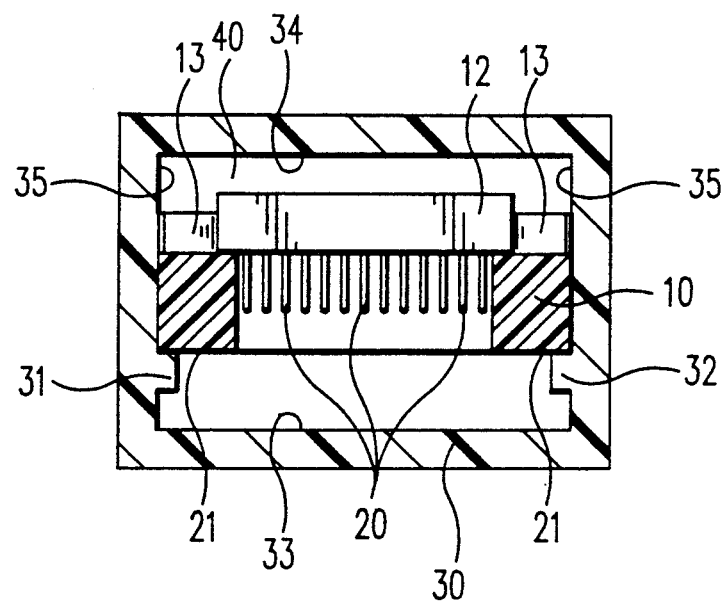
FIG. 4 is a cross-sectional view of a CPGA module in a module compartment in a specially designed shipping tube.

FIG. 4 is a cross-sectional view of a CPGA module (12) on the chip-carrying strip (10) both disposed within a specially designed shipping (carrying) tube (30). In the preferred embodiment, the shipping tube (30) has a pair of rails (31 and 32) which extend substantially the entire length of opposite internal sides (35) of the shipping tube. Each side of the carrying strip (10) rests on a rail (31 and 32) in the tube (30). The rails (31 and 32) elevate the chip-carrying strip (10) above the bottom surface (33) of the interior of the shipping tube (30). The shipping tube (30) is tall enough that the top of a CPGA module (12) will not touch the top internal surface (34) of the tube. The shipping tube (30) is wide enough that both sides of a CPGA module (12) on the strip will not touch the sides of the interior (35) of the shipping tube. These module clearances from the internal surfaces of the tube (30) provide additional protection from mechanical shock and vibration damage.

The cross section of FIG. 4 is taken through the carrier assembly at a module compartment (40). As already noted, a pair of bumpers (13) adjacent a pin cavity (11) define longitudinal ends of a module compartment (40). The internal sides (35) and the top internal surface (34) of the shipping tube (30) are the module compartment's side walls and ceiling and the carrier strip (10) is the module compartment's floor.

Figure 5:
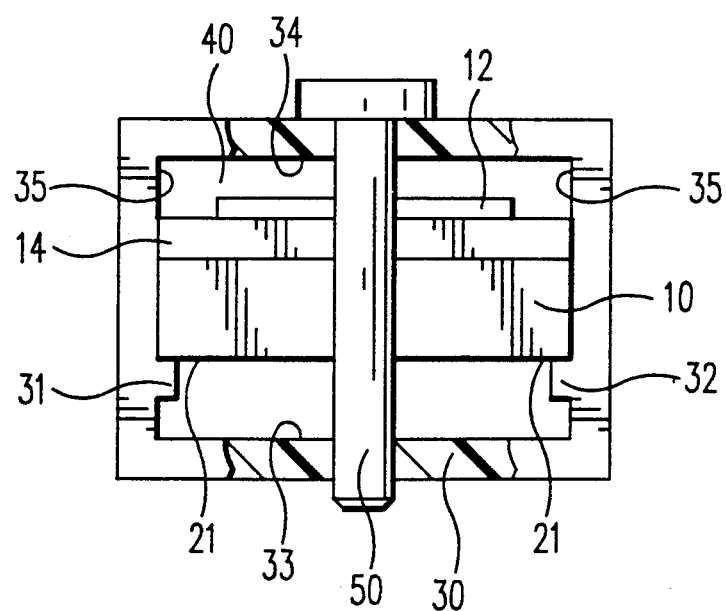
FIG. 5 is an end view of the chip-carrying strip in the specially designed shipping tube with a stopper holding the chip-carrying strip in the shipping tube.

In the preferred embodiment the shipping tube (30) is made from plastic. The plastic tube (30) may also be treated to have anti-static or static sensitive properties. See U.S. Pat. No. 4,711,350 for examples of plastic tubes to have those properties. Altertreating natively, the tube (30) may be made from metal. FIG. 5 shows one end of a loaded shipping tube. Each end of the shipping tube (30) has a stopper (50) of the type typically found in usage for module shipping tubes. The stopper (50) prevents the loaded strip from accidentally sliding out of the tube.

A chip-carrying strip (10) and shipping tube (30) thus loaded with CPGA modules (12) held in place by the spring loading effect from the bumpers (13, 14, and 15) could be adapted for automated assembly. All of the modules (12) in a shipping tube (30) are removed by sliding the chip-carrying strip (10) out of an end of the shipping tube (30). The spring loading effect of the bumpers (13, 14, and 15) would hold the modules in place on the strip. The fixed locations of the modules on the chip-carrying strip (10) would be easily located by an auto-insertion tool or a robotic insertion tool. Handling damage is minimized because human handling is minimized.

While what is considered to be the preferred embodiment of the invention is herein described, variations and modifications thereof will occur to those skilled in the art. Therefore, it is intended that the appended claims shall be construed to include the preferred embodiment and all such variations and modifications in form and detail that fall within the spirit and scope of the invention.

We claim:

1. A carrier for packaged integrated circuit chips comprising:
    a carrying tube;
    a chip-carrying strip slidably disposed in said carrying tube, said strip having a top, a bottom, a front end, a rear end, and a plurality of pin-receiving cavities spaced along the length of said strip;
    a bumper located at each end of said chip-carrying strip and a bumper located between adjacent said pin-receiving cavities; and,
    module compartments in said tube being defined above each of said pin-receiving cavities, a first end and a second end of each of said module compartments each being defined by one of said bumpers.

2. The carrier of claim 1 wherein said pin-receiving cavities are of sufficient depth that each of said pin-receiving cavities extends below pins of any packaged integrated circuit chip carried in said module compartments.

3. The carrier of claim 1 wherein said carrying strip is thicker than the length of any pin on any packaged integrated circuit chip carried thereon.

4. The carrier of claim 1 wherein said pin-receiving cavities extend through the chip-carrying strip.

5. The carrier of claim 1 wherein said chip-carrying strip is made of anti-static material.

6. The carrier of claim 1 wherein said chip-carrying strip is made of static sensitive material.

7. The carrier of claim 1 wherein said carrying tube is made of anti-static material.

8. The carrier of claim 1 wherein said carrying tube is made of static sensitive material.

9. The carrier of claim 1 wherein said carrying tube has an inner surface and an outer surface, the inner surface having a top, bottom, two sides, and a rail on each side for supporting said chip-carrying strip above said bottom such that the bottom of said carrying tube is spaced below all pins of every packaged integrated circuit chip carried by said carrying strip.

10. The carrier of claim 9 wherein each rail extends the length of the carrying tube.

11. A carrier for packaged integrated circuit chips comprising:
a carrying tube having an inner surface, the inner surface having a top, a bottom, two sides, and a rail on each side;
a chip-carrying strip having a top, a bottom, a front end, a rear end, and a plurality of pin-receiving cavities spaced along the length of said strip, said pin-receiving cavities extending through said strip, said strip slidably disposed in said carrying tube and having one side resting on one said rail and the other side resting on the other said rail above the bottom of the tube such that the bottom of the carrying tube is spaced below pins of any packaged integrated circuit chip carried by said chip-carrying strip;
a bumper located at each end of said chip-carrying strip and a bumper located between adjacent said pin-receiving cavities; and
module compartments in said tube being defined above each of said pin-receiving cavities, a first end and a second end of each of said module compartments each being defined by one of said bumpers.

12. The carrier of claim 11 wherein said chip-carrying strip is thicker than the length of any pin on any packaged integrated circuit chip carried thereon.

13. The carrier of claim 11 wherein said chip-carrying strip is made of anti-static material.

14. The carrier of claim 11 wherein said chip-carrying strip is made of static sensitive material.

15. The carrier of claim 11 wherein said carrying tube is made of anti-static material.

16. The carrier of claim 11 wherein said carrying tube is made of static sensitive material.

17. The carrier of claim 11 wherein each rail extends the length of the carrying tube.

18. A carrier for pin grid array modules comprising:
a carrying tube of anti-static material having an inner surface, the inner surface having a top, a bottom, two sides, and a rail on each side, each said rail extending the length of said tube;
a chip-carrying strip of anti-static material and having a top, a bottom, a front end, a rear end, a first side, a second side, a plurality of pin-receiving cavities extending through and spaced along the length of said strip, said strip slidably disposed in said tube and said first side resting on one said rail and said second side resting on the other said rail above said bottom such that the bottom of said carrying tube is spaced below the bottom of said strip, said strip being thicker than the length of any pins of any pin grid array module carried by said strip;
a bumper located at each end of said chip-carrying strip and a bumper located between adjacent pin-receiving cavities;
module compartments in said tube being defined above each of said pin-receiving cavities, a first end and a second end of each of said module compartments each being defined by one of said bumpers; and
a stopper at each end of the carrying tube.

19. A carrier for pin grid array modules comprising:
a carrying tube of static sensitive material having an inner surface, the inner surface having a top, a bottom, two sides, and a rail on each side, each said rail extending the length of said tube;
a chip-carrying strip of static sensitive material and having a top, a bottom, a front end, a rear end, a first side, a second side, a plurality of pin-receiving cavities extending through and spaced along the length of said strip, said strip slidably disposed in said tube and said first side resting on one said rail and said second side resting on the other rail above said bottom such that the bottom of said carrying tube is spaced below the bottom of said strip, said strip being thicker than the length of any pins of any pin grid array module carried by said strip;
a bumper located at each end of said chip-carrying strip and a bumper located between adjacent pin-receiving cavities;
module compartments in said tube being defined above each of said pin-receiving cavities, a first end and a second end of each of said module compartments each being defined by one of said bumpers; and
a stopper at each end of the carrying tube.

* * * * *

UNITED STATES PATENT AND TRADEMARK OFFICE
CERTIFICATE OF CORRECTION

PATENT NO.  : 5,064,063

DATED       : November 12, 1991

INVENTOR(S) : Anthony Manca, Henry Mayron and James Darlington Pratt

It is certified that error appears in the above-identified patent and that said Letters Patent is hereby corrected as shown below:

(Title page, Item [75])  Inventors name was omitted.  Please add James Darlington Pratt of Wappingers Falls, New York.

Signed and Sealed this

Sixteenth Day of March, 1993

Attest:

STEPHEN G. KUNIN

*Attesting Officer*     *Acting Commissioner of Patents and Trademarks*